(12) United States Patent
Liao et al.

(10) Patent No.: US 11,031,942 B2
(45) Date of Patent: *Jun. 8, 2021

(54) FREQUENCY GENERATOR AND ASSOCIATED METHOD

(71) Applicant: TAIWAN SEMICONDUCTOR MANUFACTURING COMPANY LTD., Hsinchu (TW)

(72) Inventors: Chia-Chun Liao, Taipei (TW); Min-Shueh Yuan, Taipei (TW); Chao-Chieh Li, Hsinchu (TW); Robert Bogdan Staszewski, Dublin (IE)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/985,124

(22) Filed: Aug. 4, 2020

(65) Prior Publication Data

US 2020/0366300 A1 Nov. 19, 2020

Related U.S. Application Data

(63) Continuation of application No. 16/691,016, filed on Nov. 21, 2019, now Pat. No. 10,771,072, which is a (Continued)

(51) Int. Cl.
*H03L 7/093* (2006.01)
*H03L 7/099* (2006.01)
(Continued)

(52) U.S. Cl.
CPC .......... *H03L 7/0994* (2013.01); *H03C 3/095* (2013.01); *H03C 3/0941* (2013.01);
(Continued)

(58) Field of Classification Search
CPC ..... H03L 7/0994; H03L 7/093; H03L 7/0992; H03L 7/16; H03L 2207/50; H03C 3/0941; H03C 3/0966; H03C 3/0983
See application file for complete search history.

(56) References Cited

U.S. PATENT DOCUMENTS 8,378,724 B2 * 2/2013 David .................... H03L 7/146
327/157
10,700,718 B2 * 6/2020 Shapira ................... H04B 1/04

* cited by examiner

*Primary Examiner* — Dinh T Le
(74) *Attorney, Agent, or Firm* — WPAT, P.C., Intellectual Property Attorneys; Anthony King

(57) ABSTRACT

A frequency generator is disclosed. The frequency generator is for generating an oscillator clock according to a reference clock, and the frequency generator is used in a frequency hopping system that switches a carrier frequency among a plurality of channels, and the carrier frequency further carries a modulation frequency for data transmission. The frequency generator includes: a frequency hopping and modulation control unit, arranged for generating a current channel according to a channel hopping sequence and a frequency command word (FCW) based on the reference clock, a digital-controlled oscillator (DCO), arranged for to generating the oscillator clock according to an oscillator tuning word (OTW) Obtained according to the estimated DCO normalization value. An associated method is also disclosed.

20 Claims, 10 Drawing Sheets

Related U.S. Application Data continuation of application No. 15/878,754, filed on Jan. 24, 2018, now Pat. No. 10,511,314.

(60) Provisional application No. 62/551,477, filed on Aug. 29, 2017.

(51) Int. Cl.
*H03C 3/09* (2006.01)
*H03L 7/16* (2006.01)

(52) U.S. Cl.
CPC ......... *H03C 3/0966* (2013.01); *H03C 3/0983* (2013.01); *H03C 3/0991* (2013.01); *H03L 7/093* (2013.01); *H03L 7/0992* (2013.01); *H03L 7/16* (2013.01); *H03L 2207/50* (2013.01)

FREQUENCY GENERATOR AND ASSOCIATED METHOD

CROSS REFERENCE TO RELATED APPLICATIONS

This application is a continuation of application Ser. No. 16/691,016, filed on Nov. 21, 2019, which is a continuation of application Ser. No. 15/878,754, filed on Jan. 24, 2018, which claims the benefit of U.S. provisional application 62/551,477, filed on Aug. 29, 2017. All of the above-referenced applications are hereby incorporated herein by reference in their entirety.

BACKGROUND

As known by those skilled in the art, a conventional analog PLL may be susceptible to errors (or even error propagation) since said analog PLL uses analog operations and analog elements. Therefore, digital phase-locked loops (DPLL), which utilize a counter with a variable divisor on the feedback path, are proposed for relieving the errors with the partial aid of digital operations and digital elements, and moreover, an all-digital phase-locked loop (ADPLL) may significantly help in area reduction and process migration. For example, a digitally-controlled oscillator (DCO) may be used to replace the conventionally used voltage-controlled oscillator (VCO), which is an analog element. A phase detector may also be replaced with a time-to-digital converter. Therefore, ADPLL is gaining popularity and becoming a trend in radio communications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, dimensions of the various features may be arbitrarily increased or reduced for clarity of discussion.

DETAILED DESCRIPTION

Figure 1:
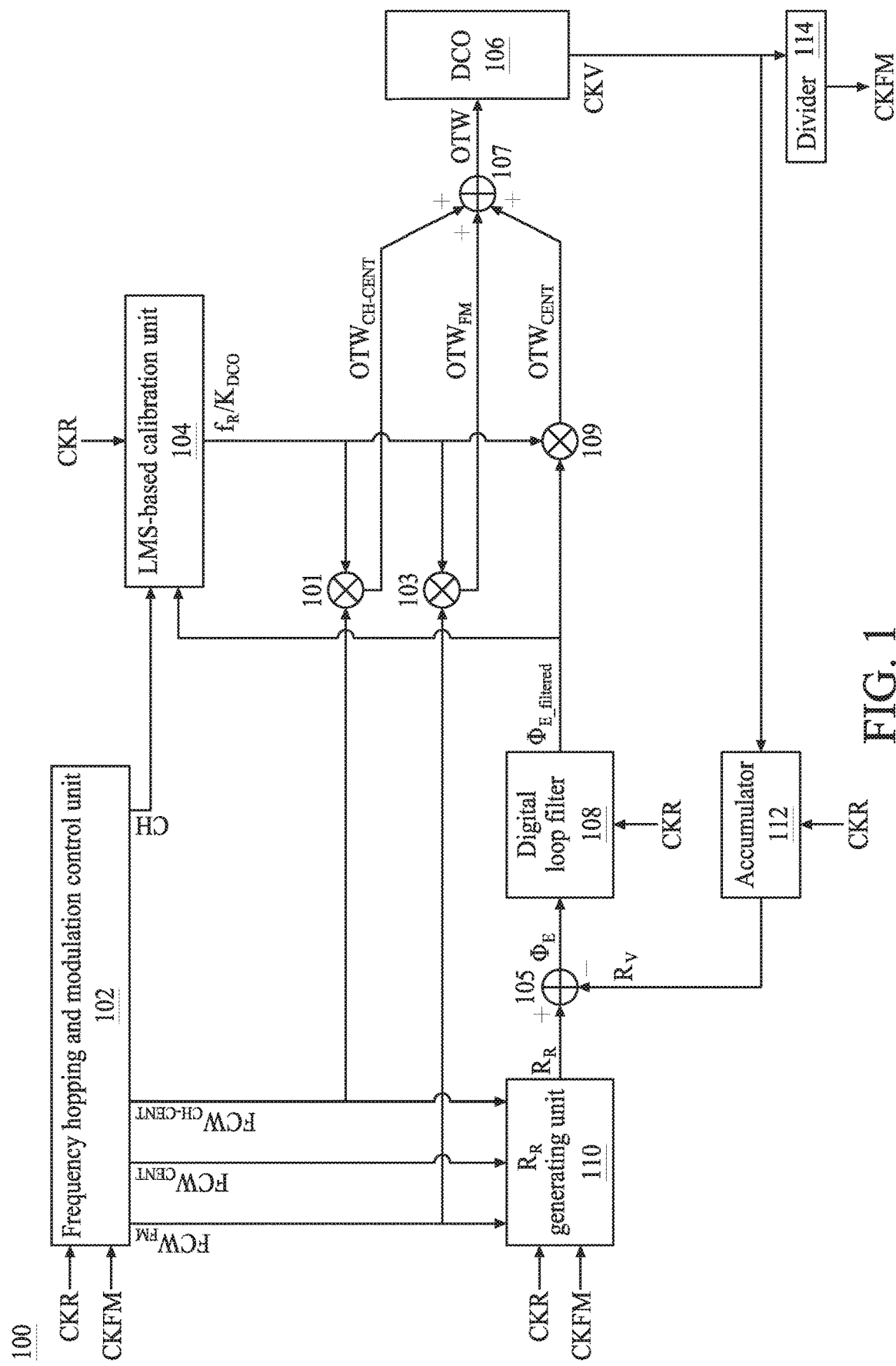
FIG. 1 is a diagram illustrating an all-digital phase locked loop (ADPLL) in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure is an apparatus and a method of calibrating the gain of a digitally controlled oscillator (DCO). The disclosure is applicable to any system in which it is desirable to estimate, calibrate and track the gain of an RF digitally controlled oscillator such as those in mobile phones and other wireless applications. The disclosure is intended for use in a digital radio transmitter or transceiver but can be used in other applications as well, such as a general communication channel. The present disclosure provides a solution to the problems and disadvantages of prior art gain calibration techniques.

To aid in understanding the principles of the present disclosure, the description is provided in the context of a digital RF processor (DRP) transmitter and receiver that may be adapted to comply with a particular wireless communications standard such as GSM, Bluetooth, WCDMA, etc. It is appreciated, however, that the disclosure is not limited to use with any particular communication standard and may be used in optical, wired and wireless applications. Further, the disclosure is not limited to use with a specific modulation scheme but is applicable to any modulation scheme including both digital and analog modulation. The disclosure is applicable to any system in which it is desirable to estimate, calibrate and track the modulation gain of a digitally controlled oscillator.

FIG. 1 is a diagram illustrating an aft-digital phase locked loop (ADPLL) 100 in accordance with various embodiments of the present disclosure. For illustration purposes only, the ADPLL 100, as shown, is adapted for a system including frequency hopping modulation, such as the Bluetooth low energy v4.0 standard. It is appreciated, however, that one skilled in the communication arts can adapt the ADPLL 100 illustrated herein to other modulations and communication standards as well without departing from the spirit and scope of the present disclosure. For example, the ADPLL 100 illustrated in FIG. 1 can be employed by the GSM/EDGE cellular standard.

In this disclosure, a reference clock CKR of the ADPLL 100 is configured to have a reference frequency $f_R$ much lower than a modulation frequency $f_{FM}$ of the modulation clock CKFM. For example, the reference frequency $f_R$ of the reference clock CKR may be 32.768 kHz for cost reduction and power saving. The modulation frequency $f_{FM}$ of the modulation clock CKFM may be about 7 to 10 MHz. However, this is not a limitation of the present disclosure. The hopping frequency level is not limited, may be in a range from kHz to 717 Hz. In this disclosure, the Bluetooth low energy v4.0 includes 40 channels each having a 2 MHz bandwidth, and the total bandwidth is 80 MHz.

The core of the ADPLL 100 is a digitally controlled oscillator (DCO) 106 adapted to generate an oscillator clock CKV. This DCO 106 here may be any type of oscillator, such as an LC tank oscillator, a ring oscillator, a Colpitts oscillator, a Hartly oscillator. The output of the DCO 106, i.e. the oscillator clock CKV, may serve as a carrier frequency of a transmitter. In many instances, the oscillator clock CKV may be further divided before using. A value of the DCO gain of the DCO 106 may be defined as a frequency of the oscillator clock CKV over an oscillator tuning word (OTW) of the DCO 106. The DCO gain may be affected by the current state of process, voltage and temperature (PVT) at any point in time. With the help of the precisely calibrated DCO gain, the ADPLL 100 is able to employ a two point direct modulation scheme and does not need to redo extra close loop locking process each time the channel is changed throughout the frequency hopping.

The close loop locking process only needs to be carried out when each time the ADPLL 100 is powered up. In particular, the ADPLL 100 of the present disclosure is configured to always stay settled to a center channel $CH_{CENT}$ among all the channels, e.g. (the $20^{th}$ channel of the Bluetooth low energy v4.0) and is configured to perform the combined channel hopping and frequency modulation by instantaneously offsetting resonance of the DCO 106 from the center channel $CH_{CENT}$ via the two point direct modulation scheme. In this way, fast frequency hopping can be achieved even at extremely low reference clock CKR since the locking time for frequency hopping is substantially zero. The accuracy of the frequency hopping modulation highly depends on accurate estimation and calibration of the DCO gain. Please note that it is not a limitation to configure the ADPLL 100 to always stay settled to the center channel $CH_{CENT}$. In many instances, the ADPLL 100 may be always stay settled to a channel that is not around the center channel $CH_{CENT}$.

The oscillator clock CKV may be divided by a divider 114 to produce the modulation clock CKFM. A frequency hopping and modulation control unit 102 is used to provide a current channel CH based on a predetermined channel hopping sequence in accordance with the system that the ADPLL 100 is designed for, e.g. the Bluetooth low energy v4.0 standard. However, this is not a limitation of the present disclosure. In some instances, the channel hopping sequence may be a random, pseudo random or periodic sequence that is predetermined or real-time generated, i.e. on-the-fly. The frequency hopping and modulation control unit 102 further generates components of an overall frequency command word (FCW). The FCW may be defined as the frequency of the oscillator clock CKV over the reference frequency $f_R$ of the reference clock CKR. The FCW includes components $FCW_{CENT}$, $FCW_{CH-CENT}$ and $FCW_{FM}$. $FCW_{CENT}$ corresponds to a frequency of the center channel $CH_{CENT}$, e.g. (the $20^{th}$ channel of the Bluetooth low energy v4.0). $FCW_{CH-CENT}$ corresponds to a frequency of the difference between the center channel $CH_{CENT}$ and a channel indicated by the signal CH. $FCW_{FM}$ corresponds to a frequency of the frequency modulation. The overall frequency command word FCW is defined as the frequency division ratio of an expected variable frequency $f_V$ of the oscillator clock CKV to the reference frequency $f_R$ of the reference clock CKR. In the present disclosure, $FCW_{CENT}$ and $FCW_{CH-CENT}$ belong to the reference clock CKR domain, and $FCW_{FM}$ belongs to the oscillator clock CKV domain.

A Least mean squares (LMS)-based calibration unit 104 is used to iteratively calibrate an estimated DCO gain $K_{DCO}$ based on the LMS algorithm during frequency hopping according to the channel CH and a filtered phase error (i.e. $\varphi_{E\_filtered}$ as shown in FIG. 1) output by a digital loop filter 108. The LMS-based calibration unit 104 outputs an estimated DCO normalization value (i.e. $f_R/K_{DCO}$ as shown in FIG. 1) for generating components of the oscillator tuning word (OTW), including $OTW_{CENT}$, $OTW_{CH-CENT}$ and $OTW_{FM}$. $OTW_{CENT}$ corresponds to the center channel $CH_{CENT}$, e.g. (the $20^{th}$ channel of the Bluetooth low energy v4.0). $OTW_{CH-CENT}$ corresponds to the difference between the center channel $CH_{CENT}$ and the current channel CH. $OTW_{FM}$ corresponds to frequency modulation. In particular, $OTW_{CENT}$ is a product of a multiplier 109 that multiplies the estimated DCO normalization value $f_R/K_{DCO}$ by the filtered phase error $\varphi_{E\_filtered}$. $OTW_{CH-CENT}$ is a product of a multiplier 101 that multiplies the estimated DCO normalization value $f_R/K_{DCO}$ by the FCW component $FCW_{CH-CENT}$. $OTW_{FM}$ is a product of a multiplier 103 that multiplies the estimated DCO normalization value $f_R/K_{DCO}$ by the FCW component $FCW_{FM}$. The OTW components $OTW_{CENT}$, $OTW_{CH-CENT}$, and $OTW_{FM}$ then are summed up by an adder 107 and fed to the DCO 106.

An $R_R$ generating unit 110 is used to generate a reference phase $R_R$ according to the reference clock CKR, the modulation clock CKFM, the FCW components $FCW_{FM}$, $FCW_{CENT}$, and $FCW_{CH\text{-}CENT}$. An accumulator 112 is used to generate a variable phase $R_V$ according to the reference clock CKR and the oscillator clock CKV. A phase error $\varphi_E$ is obtained by subtracting the variable phase $R_V$ from the reference phase $R_R$ according through an adder 105. The variable phase Rv output from the accumulator 112 reflects a cycle number of the oscillator clock CKV per cycle of the reference clock CKR. The reference phase $R_R$ output from the $R_R$ generating unit 110 reflects the averaged FCW (i.e. $FCW_{CENT}+FCW_{CH\text{-}CENT}+$averaged $FCW_{FM}$) per cycle of the reference clock CKR.

Figure 2:
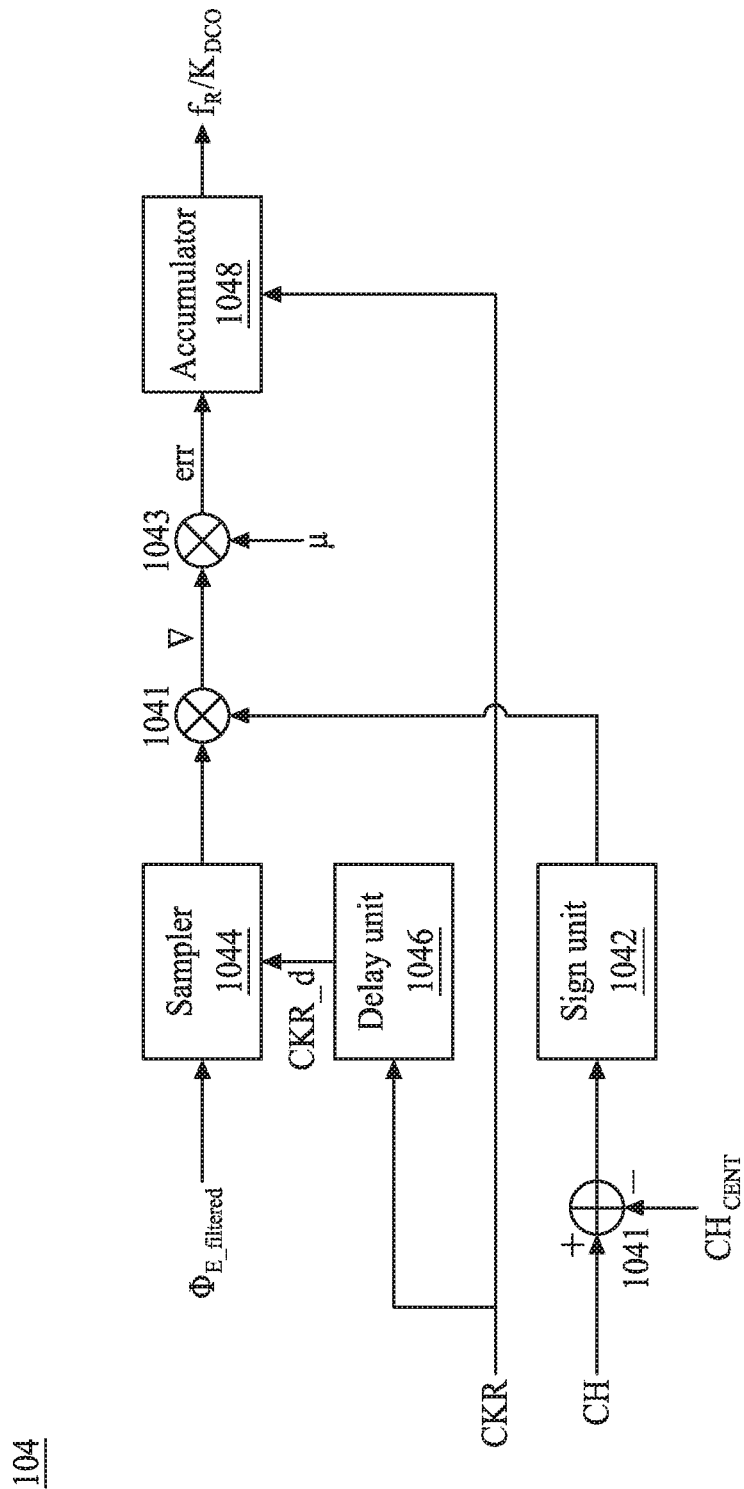
FIG. 2 is a diagram illustrating an LMS-based calibration unit in accordance with a first embodiment of the present disclosure.

FIG. 2 is a diagram illustrating the LMS-based calibration unit 104 in accordance with a first embodiment of the present disclosure. The LMS-based calibration unit 104 includes a sampler 1044 to sample the received the filtered phase error $\varphi_{E\_filtered}$ according to a delayed reference clock CKR_d. The delayed reference clock CKR_d is obtained by delaying the reference clock CKR, and a delay time thereof is determined according to a delay unit 1046. In the present disclosure, the delay time is predetermined. A sign unit 1042 is configured to perform a sign function, i.e. to extract the sign, upon (the current channel CH—the center channel $CH_{CENT}$). For instance, when the center channel is the $20^{th}$ channel and the frequency hopping and modulation control unit 102 controls ADPLL 100 hopping to the $30^{th}$ channel, sign (30−20) is +1 and the sign unit 1042 output +1. When the center channel is the $20^{th}$ channel and the frequency hopping and modulation control unit 102 controls ADPLL 100 hopping to the $8^{th}$ channel, sign (8−20) is −1 and the sign unit 1042 output −1. In the present disclosure, when the current channel CH and the center channel are the same, the sign unit 1042 output +1.

The sampled filtered phase error $\varphi_{E\_filtered}$ is then multiplied by the sign (CH−$CH_{CENT}$) to obtain a gradient $\nabla$, and the gradient $\nabla$ is multiplied by a step size $\mu$ to obtain a phase error err. The step size $\mu$ may be a predetermined value or can adaptively change according to the status of convergence. An accumulator 1048 is configured to accumulate the phase error err and is operated at the reference clock CKR domain. The accumulated phase error err is also representative of the estimated DCO normalization value $f_R/K_{DCO}$. The behavior of the LMS-based calibration unit 104 of FIG. 2 can be summarized as $f_R/K_{DCO}[n]=f_R/K_{DCO}[n-1]+\mu*\varphi_{E\_filtered}[n]*\text{sign}(CH-CH_{CENT})$, where n is the index of the reference clock CKR.

Figure 3:
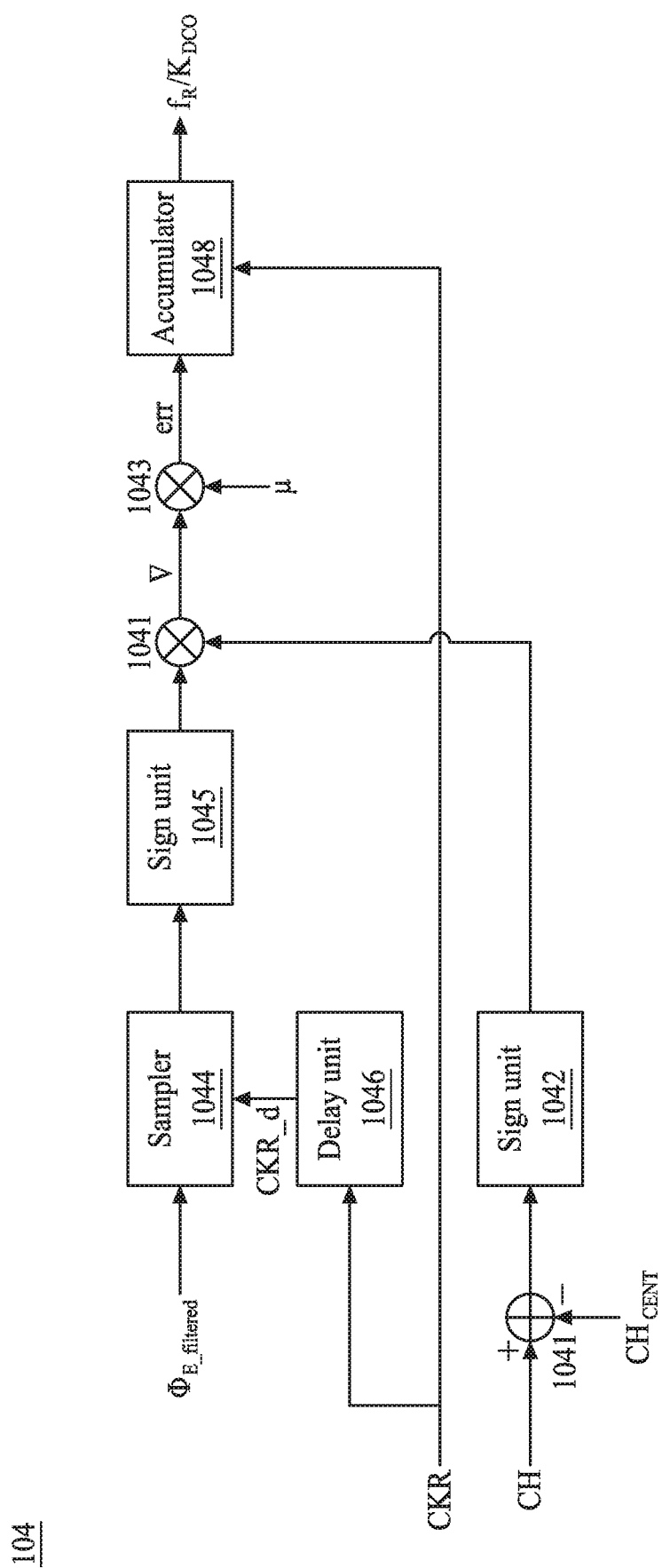
FIG. 3 is a diagram illustrating an LMS-based calibration unit in accordance with a second embodiment of the present disclosure.
Figure 4:
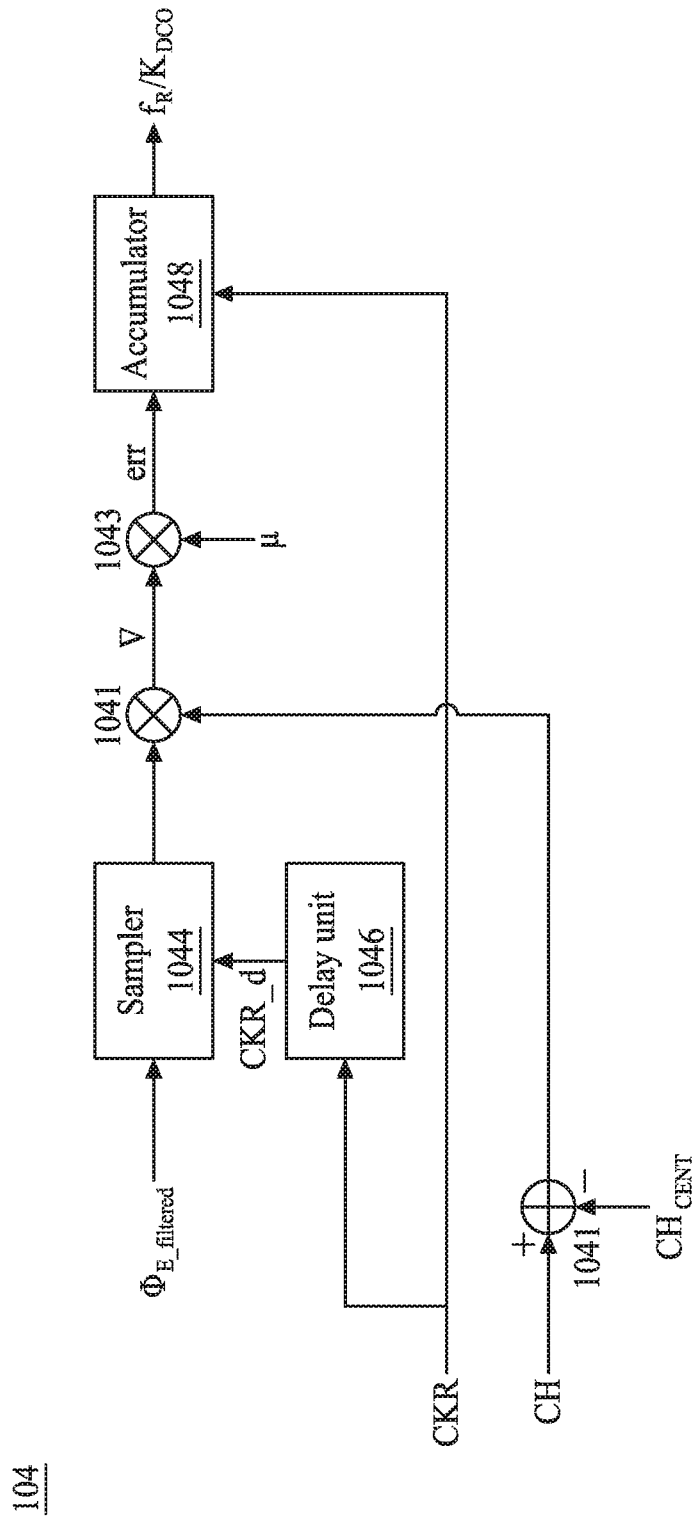
FIG. 4 is a diagram illustrating an LMS-based calibration unit in accordance with a third embodiment of the present disclosure.
Figure 5:
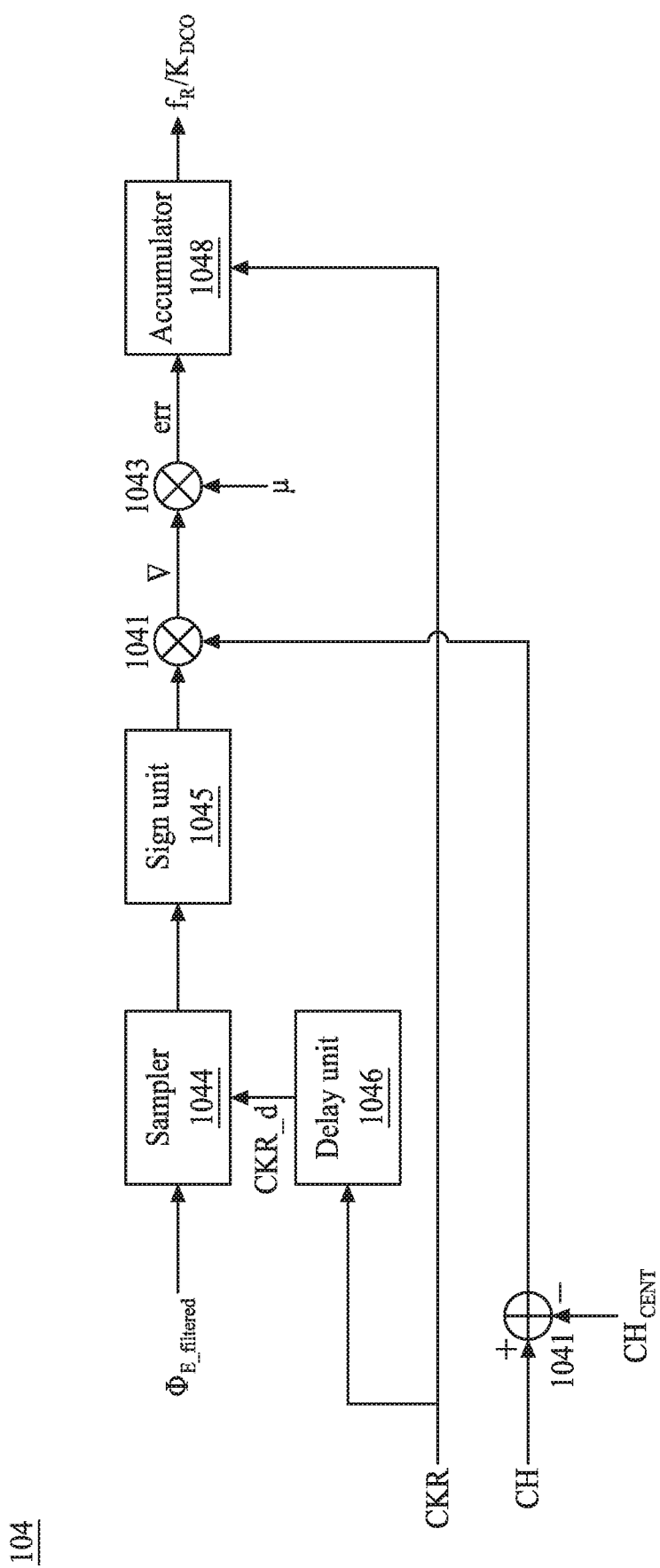
FIG. 5 is a diagram illustrating an LMS-based calibration unit in accordance with a fourth embodiment of the present disclosure.

Alternative embodiments of the LMS-based calibration unit 104 are shown in FIG. 3 to FIG. 5. FIG. 3 is a diagram illustrating the LMS-based calibration unit 104 in accordance with a second embodiment of the present disclosure. In FIG. 3, another sign unit 1045 shows to extract the sign of the sampled filtered phase error $\varphi_{E\_filtered}$. The behavior of the LMS-based calibration unit 104 of FIG. 3 can be summarized as $f_R/K_{DCO}[n]=f_R/K_{DCO[n-1]}+\mu*\text{sign}(\varphi_{E\_filtered}[n])*\text{sign}(CH-CH_{CENT})$, where n is the index of the reference clock CKR.

FIG. 4 is a diagram illustrating the LMS-based calibration unit 104 in accordance with a third embodiment of the present disclosure. In FIG. 4, no sign units are used, The behavior of the LMS-based calibration unit 104 of FIG. 4 can be summarized as $f_R/K_{DCO}[n]=f_R/K_{DCO}[n-1]+\mu*\varphi_{E\_filtered}[n]*(CH-CH_{CENT})$, where n is the index of the reference clock CKR. FIG. 5 is a diagram illustrating the LMS-based calibration unit 104 in accordance with a fourth embodiment of the present disclosure. The behavior of the LMS-based calibration unit 104 of FIG. 3 can be summarized as $f_R/K_{DCO}[n]=f_R/K_{DCO}[n-1]\mu*\text{sign}(\varphi_{E\_filtered}[n])*(CH-CH_{CENT})$, where n is the index of the reference clock CKR.

Figure 6:
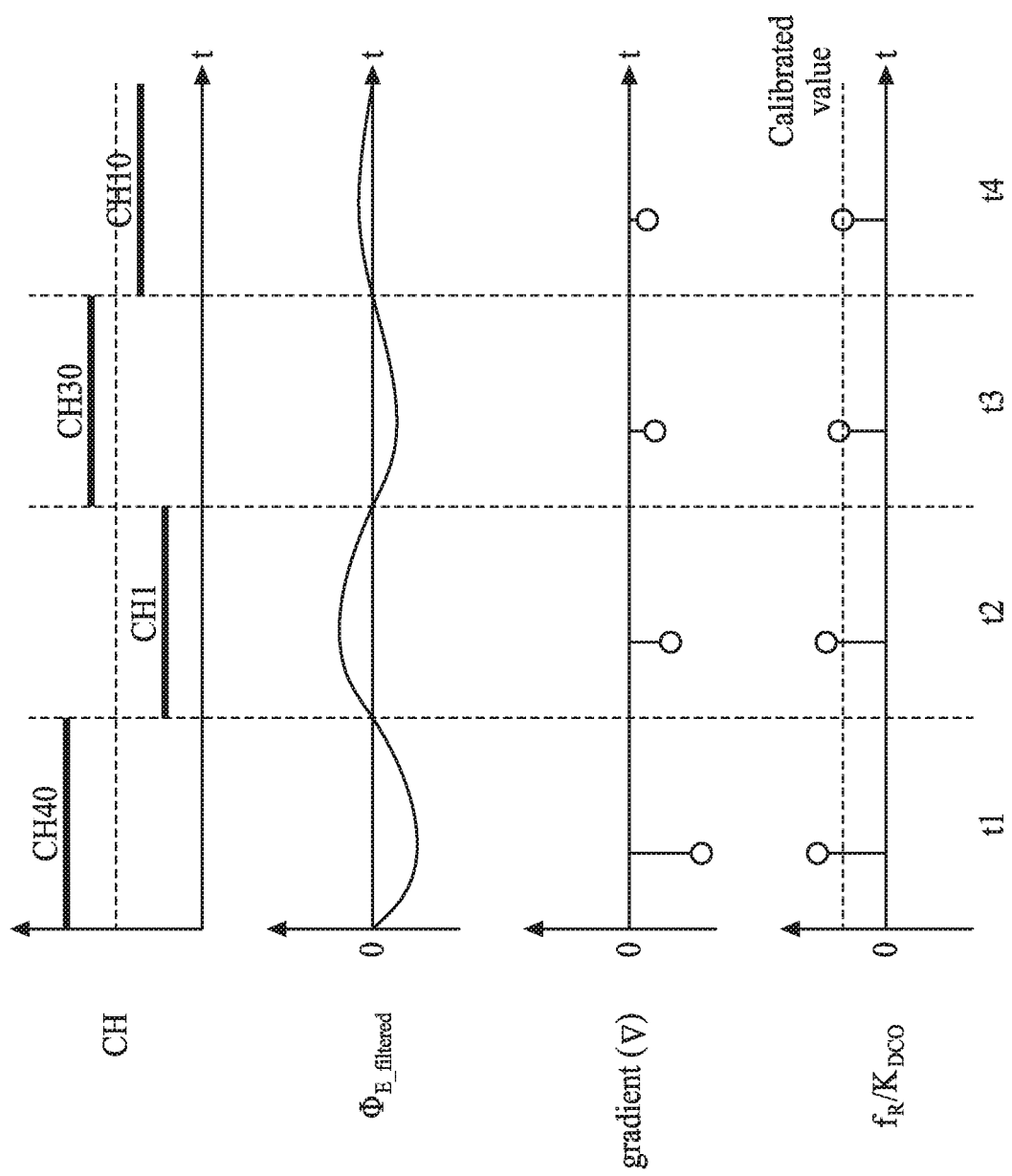
FIG. 6 is a timing diagram illustrating convergence of an estimated DCO normalization value during frequency hopping in accordance with various embodiments of the present disclosure.

FIG. 6 is a timing diagram illustrating convergence of the estimated DCO normalization value during frequency hopping in accordance with various embodiments of the present disclosure in FIG. 6, the center channel $CH_{CENT}$ is configured to be the $20^{th}$ channel. At time point t1, the current channel CH is the $40^{th}$ channel, as such sign (CH−$CH_{CENT}$) is +1. After multiplying the filtered phase error $\varphi_{E\_filtered}[t1]$ having a negative value by +1, the gradient $\nabla[t1]$ having a negative value is obtained. The gradient $\nabla[t1]$ is then multiplied by the step size $\mu$ and accumulated with the previous estimated DCO normalization value $f_R/K_{DCO}$ by the accumulator 1048, to output the current estimated DCO normalization value $f_R/K_{DCO}[t1]$. At time point t2, the current channel CH is the $1^{st}$ channel, as such sign (CH−$CH_{CENT}$) is −1. After multiplying the filtered phase error $\varphi_{E\_filtered}[t2]$ having a positive value by −1, the gradient $\nabla[t2]$ having a negative value is obtained. The gradient $\nabla[t2]$ is then multiplied by the step size $\mu$ and accumulated with the previous estimated DCO normalization value $f_R/K_{DCO}[t1]$ by the accumulator 1048, to output the current estimated DCO normalization value $f_R/K_{DCO}[t2]$. As illustrated in FIG. 6, the current estimated DCO normalization value $f_R/K_{DCO}[t2]$ has a value less than the previous estimated DCO normalization value $f_R/K_{DCO}[t1]$ since the gradient $\nabla[t2]$ is a negative value.

It can be seen from FIG. 6 that the current channel CH then hops to the $30^{th}$ channel, and then to the $10^{th}$ channel, and the estimated DCO normalization value $f_R/K_{DCO}[t3]$ and the estimated DCO normalization value $f_R/K_{DCO}[t4]$ are gradually converges to the dashed line, which represents the calibrated value of the estimated DCO normalization value $f_R/K_{DCO}[t3]$ and estimated DCO normalization value $f_R/K_{DCO}$.

In light of the above, the estimated DCO normalization value $f_R/K_{DCO}$ can be precisely calibrated during the frequency hopping. The precisely estimated DCO normalization value $f_R/K_{DCO}$ is advantageous for two point direct modulation scheme since the estimated DCO normalization value $f_R/K_{DCO}$ can be used to produce the oscillator tuning word OTW directly. The OTW component $OTW_{CH\text{-}CENT}$ is obtained by multiplying the FCW component $FCW_{CH\text{-}CENT}$ by the estimated DCO normalization value $f_R/K_{,DCO}$; and the OTW component $OTW_{FM}$ is obtained by multiplying the FCW component $FCW_{FM}$ by the estimated DCO normalization value $f_R/K_{DCO}$; and the OTW component $OTW_{CENT}$ is obtained by multiplying the filtered phase error $\varphi_{E\_filtered}$ by the estimated DCO normalization value $f_R/K_{DCO}$. If the estimated DCO normalization value $f_R/K_{DCO}$ is accurate enough, the ADPLL 100 is able to instantaneously hop to any channel with high accuracy.

Figure 7:
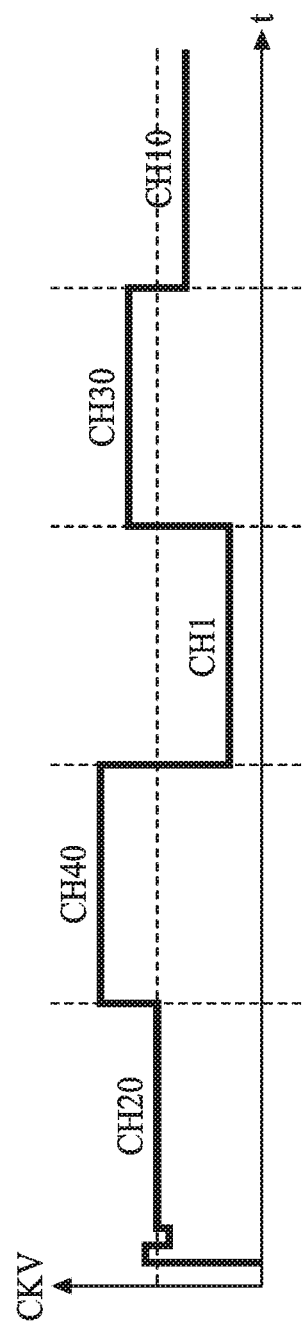
FIG. 7 is a timing diagram illustrating an oscillator clock during frequency hopping in accordance with various embodiments of the present disclosure.

FIG. 7 is a timing diagram illustrating the oscillator clock CKV during frequency hopping in accordance with various embodiments of the present disclosure. Compared to conventional ADPLL, the ADPLL 100 of the present disclosure only performs the close loop locking process at the initial stage, e.g. when the ADPLL 100 is powered on. Please note that in FIG. 7, the frequency modulation is omitted for conciseness.

Figure 8:
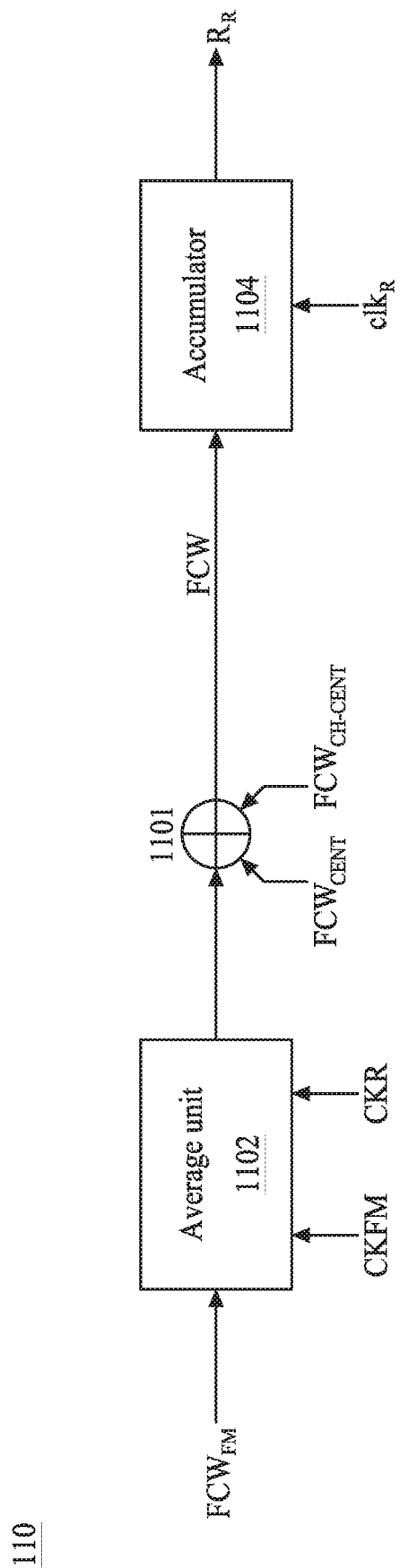
FIG. 8 is a diagram illustrating an $R_R$ generating unit in accordance with various embodiments of the present disclosure.

FIG. 8 is a diagram illustrating the $R_R$ generating unit 110 in accordance with various embodiments of the present disclosure. As mentioned above, the $R_R$ generating unit 110 is used to generate the reference phase $R_R$ according to the reference clock CKR, the modulation clock CKFM, the FCW components $FCW_{FM}$, $FCW_{CENT}$, and $FCW_{CH-CENT}$. The $R_R$ generating unit 110 includes an average unit 1102, an accumulator 1104 and an adder 1101. The average unit 1102 is used to obtain an average value of the FCW components $FCW_{FM}$ in each cycle of the reference clock CKR, The averaged $FCW_{FM}$ is added to the FCW components $FCW_{CENT}$, and $FCW_{CH-CENT}$ to obtain the overall frequency command word FCW. The overall frequency command word FCW then is accumulated in the accumulator 1104 and the accumulated overall frequency command word FCW is output as the reference phase $R_R$.

Referring back to FIG. 1, the accumulator 112 is used to accumulate the number of rising edges of the oscillator clock CKV in each cycle of the reference clock CKR, and the accumulated number of rising edges of the oscillator clock CKV is output as the variable phase $R_V$. The difference between the reference phase $R_R$ and the variable phase $R_V$ is the phase error $\varphi_E$. By using the $R_R$ generating unit 110 and the accumulator 112 to calculate the reference phase $R_R$ and the variable phase $R_V$, the reference frequency $f_R$ of the reference clock CKR can be configured to be lower than the modulation frequency $f_{FM}$ of the modulation clock CKFM.

Figure 9:
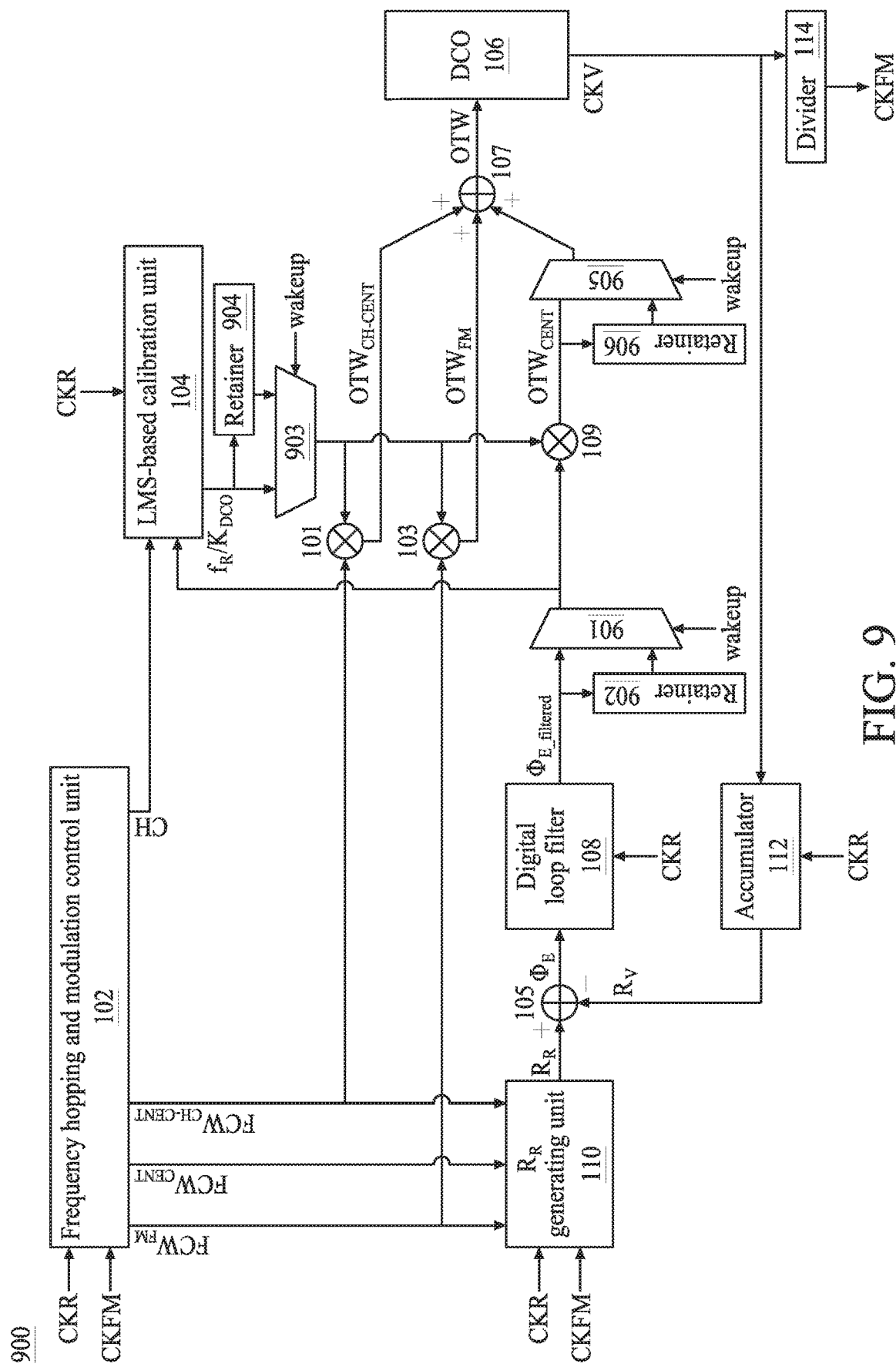
FIG. 9 is a diagram illustrating an ADPLL in accordance with various embodiments of the present disclosure.

FIG. 9 is a diagram illustrating an ADPLL 900 in accordance with various embodiments of the present disclosure. Compared to the ADPLL 100, the ADPLL 900 further includes a retainer 902 for storing the filtered phase error $\varphi_{E\_filtered}$. In particular, the retainer 902 is configured to store the filtered phase error $\varphi_{E\_filtered}$ before the ADPLL 900 entering into a power saving mode. In many instances, the retainer 902 always updates the filtered phase error $\varphi_{E\_filtered}$ when the ADPLL 900 operates in a normal mode. The date stored in the retainer 902 is not effected even when the ADPLL 900 enters into the power saving mode. For example, the retainer 902 may be supplied by a voltage source which is not powered down during the power saving mode. When the ADPLL 900 is waked up, the filtered phase error $\varphi_{E\_filtered}$ stored in the retainer 902 can be immediately resumed and fed to the subsequent LMS-based calibration unit 104 and the multiplier 109 for use via a multiplexer 901. The multiplexer 901 selectively outputs the filtered phase error $\varphi_{E\_filtered}$ from the digital loop filter 108 or the retainer 902 according to a signal wakeup, which indicates whether the ADM; 900 is in the power saving mode. In this way, fast wake up of the ADPLL 900 can be achieved.

Moreover, the ADPLL 900 further includes a retainer 904 for storing the estimated DCO normalization value $f_R/K_{DCO}$ and a retainer 906 for storing the OTW component $OTW_{CENT}$. Similar to the retainer 902, the retainers 904 and 906 can temporarily store data in before the ADPLL 900 entering into the power saving mode, and the stored data can be used for fast wake up when the ADPLL 900 leaves the power saving mode and enters the normal mode.

Figure 10:
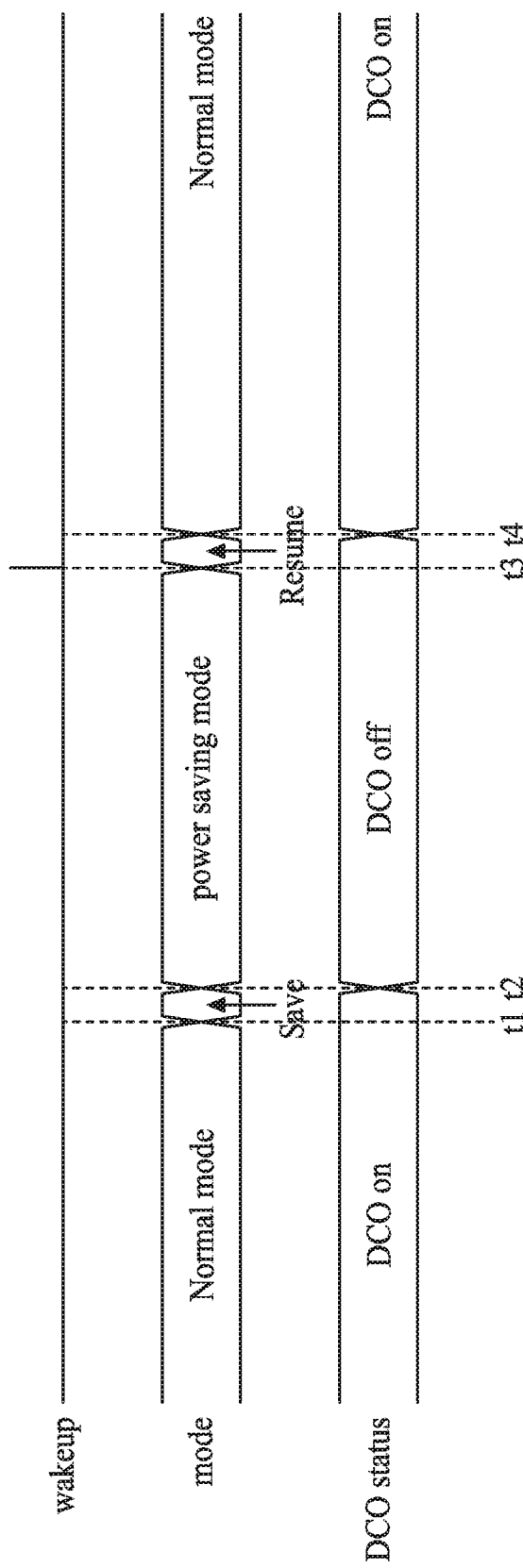
FIG. 10 is a timing diagram illustrating the status of the DCO at different modes in accordance with various embodiments of the present disclosure.

FIG. 10 is a timing diagram illustrating the status of the DCO 106 at different modes in accordance with various embodiments of the present disclosure. The ADPLL 900 is initially configured to be in the normal mode. At time point t1, the retainers 902, 904 and 906 save the filtered phase error $\varphi_{E\_filtered}$, the estimated DCO normalization value $f_R/K_{DCO}$ and the OTW component $OTW_{CENT}$ respectively. Then the ADPLL 900 enters into the power saving mode at time point t2, and the DCO 106 is turned off. At time point t3, the signal wakeup is asserted, and the ADPLL 900 starts to resumes the filtered phase error $\varphi_{E\_filtered}$, the estimated DCO normalization value $f_R/K_{DCO}$ and the OTW component $OTW_{CENT}$ stored in the retainers 902, 904 and 906. In this way, the DCO 106 is able to be back to normal operation and directly produce a desired frequency at time point t4 in a short time.

Some embodiment of the present disclosure provides a frequency generator for generating an oscillator clock according to a reference clock, the frequency generator being used in a frequency hopping system that switches a carrier frequency among a plurality of channels, the carrier frequency further carrying a modulation frequency for data transmission. The frequency generator includes: a frequency hopping and modulation control unit, arranged for generating a current channel according to a channel hopping sequence and a frequency command word (FCW) based on the reference clock, wherein the FCW includes: a first FCW component corresponding to a frequency of a predefined channel; a second FCW component corresponding to a frequency difference between the predefined channel and the current channel; and a third FCW component corresponding to the modulation frequency; a calibration unit, arranged for iteratively calibrating an estimated DCO normalization value during frequency hopping according to the current channel and a phase error obtained according to the oscillator clock and the reference clock; and a digital-controlled oscillator (DCO), arranged for to generating the oscillator clock according to an oscillator tuning word (OTW) obtained according to the estimated DCO normalization value.

Some embodiment of the present disclosure provides a frequency generator for generating an oscillator clock according to a reference clock, the frequency generator being used in a frequency hopping system that switches a carrier frequency among a plurality of channels, the carrier frequency further carrying a modulation frequency for data transmission. The frequency generator includes: a frequency hopping and modulation control unit, arranged for generating a current channel according to a channel hopping sequence; a calibration unit, arranged for iteratively calibrating an estimated DCO normalization value during frequency hopping according to the current channel and a phase error obtained according to the oscillator clock and the reference clock, the calibration unit including: a sampler, arranged for sampling the phase error according to the reference clock; and an arithmetic unit, arranged for obtain a difference by subtracting a predefined channel from the current channel; and a digital-controlled oscillator (DCO), arranged for to generating the oscillator clock according to an oscillator tuning word (OTW) obtained according to the estimated DCO normalization value.

Some embodiment of the present disclosure provides a frequency generation method for generating an oscillator clock according to a reference clock, the frequency generation method being used for a frequency hopping system that switches a carrier frequency among a plurality of channels, the carrier frequency further carrying a modulation frequency for data transmission. The method includes: providing a current channel according to a channel hopping sequence; and iteratively calibrating an estimated DCO normalization value during frequency hopping at least according to the current channel.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital-controlled oscillator (DCO) controller for controlling a DCO through an oscillator tuning word (OTW), wherein the DCO generates an oscillator clock according to a reference clock, the DCO controller is used in a frequency hopping system that switches a carrier frequency among a plurality of channels, the carrier frequency further carrying a modulation frequency for data transmission, and the DCO controller comprises:
    a frequency hopping and modulation control unit, arranged for generating a current channel according to a channel hopping sequence and a frequency command word (FCW) based on the reference clock;
    a calibration unit, arranged for generating an estimated DCO normalization value according to the current channel and a phase error obtained according to the oscillator clock and the reference clock; and
    an OTW generator, arranged for generating the OTW according to the estimated DCO normalization value.

2. The DCO controller of claim 1, wherein the estimated DCO normalization value is a function of a frequency of the reference clock over a DCO gain.

3. The DCO controller of claim 2, wherein the DCO gain is a function of a frequency of the oscillator clock over the OTW.

4. The DCO controller of claim 1, wherein the FCW is a function of a frequency of the oscillator clock over a frequency of the reference clock.

5. The DCO controller of claim 1, wherein the FCW includes a first FCW component corresponding to a frequency of a predefined channel, and the predefined channel is a middle channel among the plurality of channels.

6. The DCO controller of claim 1, wherein the calibration unit iteratively calibrates the estimated DCO normalization value during frequency hopping based on the LMS algorithm.

7. The DCO controller of claim 5, wherein the OTW includes:
    a first OTW component corresponding to the frequency of the predefined channel;
    a second OTW component corresponding to a frequency difference between the predefined channel and the current channel; and
    a third OTW component corresponding to the modulation frequency.

8. The DCO controller of claim 7, wherein the FCW further includes a second FCW component corresponding to the frequency difference between the predefined channel and the current channel, and the OTW generator further comprises a first multiplier, arranged for multiplying the second FCW component by the estimated DCO normalization value to generate the second OTW component.

9. The DCO controller of claim 8, wherein the FCW further includes a third FCW component corresponding to the modulation frequency, and the OTW generator further comprises a second multiplier, arranged for multiplying the third FCW component by the estimated DCO normalization value to generate the third OTW component.

10. The DCO controller of claim 9, wherein the OTW generator further comprises a third multiplier, arranged for multiplying the phase error by the estimated DCO normalization value to generate the third OTW component.

11. A frequency generator for generating an oscillator clock according to a reference clock, the frequency generator being used in a frequency hopping system that switches a carrier frequency among a plurality of channels, the carrier frequency further carrying a modulation frequency for data transmission, the frequency generator comprising:
    a frequency hopping and modulation control unit, arranged for generating a current channel according to a channel hopping sequence;
    a calibration unit, arranged for sampling a phase error according to the reference clock, and generating an estimated DCO normalization value according to the current channel and the phase error obtained according to the oscillator clock and the reference clock;
    an oscillator tuning word (OTW) generator, arranged for generating an OTW according to the estimated DCO normalization value; and
    a digital-controlled oscillator (DCO), arranged for to generating the oscillator clock according to the OTW.

12. The frequency generator of claim 11, wherein the estimated DCO normalization value is a function of a frequency of the reference clock over a DCO gain.

13. The frequency generator of claim 12, wherein the DCO gain is a function of a frequency of the oscillator clock over the OTW.

14. The frequency generator of claim 11, wherein the calibration unit further obtains a difference by subtracting a predefined channel from the current channel, and extracts a sign of the difference.

15. The frequency generator of claim 14, wherein the calibration unit further generates a gradient by multiplying the sign by the sampled phase error.

16. The frequency generator of claim 15, wherein the calibration unit further generates the estimated DCO normalization value according to the gradient.

17. The frequency generator of claim 14, wherein the predefined channel is a middle channel among the plurality of channels.

18. A method for controlling an digital-controlled oscillator (DCO) through an oscillator tuning word (OTW), wherein the DCO generates an oscillator clock according to a reference clock, the method is used for a frequency hopping system that switches a carrier frequency among a plurality of channels, the carrier frequency further carrying a modulation frequency for data transmission, and the method comprises:
    obtaining a channel hopping sequence, wherein the channel hopping sequence indicates a sequence of change of a current channel among the plurality of channels of the frequency hopping system;
    obtaining the current channel among the plurality of channels according to the channel hopping sequence;

generating an estimated digital-controlled oscillator (DCO) normalization value at least according to the current channel, wherein the estimated DCO normalization value is a function of a frequency of the reference clock over a DCO gain, and the DCO gain is a function of a frequency of the oscillator clock over the OTW; and generating the OTW according to the estimated DCO normalization value.

19. The method of claim 18, further comprising:

generating a phase error according to the oscillator clock and the reference clock.

20. The method of claim 19, wherein the generation of the estimated DCO normalization value at least according to the current channel comprises:

iteratively calibrating the estimated DCO normalization value during frequency hopping at least according to the current channel and the phase error.

* * * * *